(12) United States Patent
McKnight et al.

(10) Patent No.: US 11,270,827 B1
(45) Date of Patent: Mar. 8, 2022

(54) SHUNTING VIBRATIONAL MAGNETIC TRANSMITTER

(71) Applicant: HRL LABORATORIES, LLC, Malibu, CA (US)

(72) Inventors: Geoffrey P. McKnight, Los Angeles, CA (US); Christopher B. Churchill, Ventura, CA (US); Walter S. Wall, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 242 days.

(21) Appl. No.: 16/011,964

(22) Filed: Jun. 19, 2018

Related U.S. Application Data

(60) Provisional application No. 62/522,519, filed on Jun. 20, 2017.

(51) Int. Cl.
*H02N 2/18* (2006.01)
*H01F 7/20* (2006.01)
*H01Q 7/00* (2006.01)
*H01L 41/12* (2006.01)

(52) U.S. Cl.
CPC .......... *H01F 7/20* (2013.01); *H01L 41/12* (2013.01); *H01L 41/125* (2013.01); *H01Q 7/00* (2013.01); *H02N 2/186* (2013.01); *H02N 2/188* (2013.01)

(58) Field of Classification Search
CPC .......... H01F 7/20; H02N 2/186; H02N 2/188; H01L 41/12; H01L 41/125
USPC .............................................. 335/215; 310/26
See application file for complete search history.

(56) References Cited

U.S. PATENT DOCUMENTS 9,960,341 B1 * 5/2018 Daw ................ G01N 29/2412
2014/0346902 A1 * 11/2014 Ueno .................... H01L 41/125
310/26

FOREIGN PATENT DOCUMENTS

JP    2004119662 A * 4/2004

OTHER PUBLICATIONS

Ueno et al., "Design of Magnetostrictive/Piezoelectric Laminate Composite for Coil-Less Magnetic Force Control," IEEE Transactions of Magnetics, 41(4): 1233-1237, Apr. 2005.
Scheidler et al., "Dynamic Characterization of Galfenol ($Fe_{81.6}Ga_{18.4}$)," NASA/TP, 72 pages, 2016.

* cited by examiner

*Primary Examiner* — Ramon M Barrera
(74) *Attorney, Agent, or Firm* — Lewis Roca Rothgerber Christie, LLP

(57) ABSTRACT

A magnetic transmitter including at least one magnetoelastic element, a magnetic field source, and an actuator operably coupled to the magnetoelastic element. The magnetoelastic element is oriented parallel to the magnetic field source. The magnetic field source is configured to induce a magnetic flux in the magnetoelastic element, and the actuator is configured to induce harmonic vibration in the magnetoelastic element. The magnetoelastic element is oriented parallel to the magnetic field source. The harmonic vibration of the magnetoelastic element is configured to change a net magnetic dipole of the magnetic transmitter due to magnetostriction.

21 Claims, 5 Drawing Sheets

SHUNTING VIBRATIONAL MAGNETIC TRANSMITTER

CROSS-REFERENCE TO RELATED APPLICATION(S)

This application claims priority to and the benefit of U.S. Provisional Application No. 62/522,519, filed Jun. 20, 2017, the entire content of which is incorporated herein by reference.

FIELD

The present disclosure relates generally to magnetic transmitters.

BACKGROUND

Very low frequency (VLF) and ultra-low frequency (ULF) electromagnetic waves are difficult to produce with related art electrically resonating antennas because the physical size of the antenna to efficiency produce high power levels, which is a fraction of a single wavelength, becomes impractically large for small platforms at frequencies below 100 kHz. For instance, large antennas for VLF frequency transmitters can be as large as many acres and require a conductive screen suspended hundreds of feet off the ground. Additionally, the production of sizeable magnetic fields using loop stick antennas with oscillating current requires significant power due to the combined resistive losses in the magnetizing coils and ferromagnetic cores at 1,000-30,000 Hz.

SUMMARY

The present disclosure is directed toward various embodiments of magnetic transmitters. In one embodiment, the magnetic transmitter includes at least one magnetoelastic element, a magnetic field source, and an actuator operably coupled to the magnetoelastic element. The magnetic field source is configured to induce a magnetic flux in the magnetoelastic element, and the actuator is configured to induce harmonic vibration in the magnetoelastic element. The magnetoelastic element is oriented parallel to the magnetic field source. The harmonic vibration of the magnetoelastic element is configured to change a net magnetic dipole of the magnetic transmitter due to magnetostriction.

The magnetic transmitter may include a magnetic yoke including a first arm and a second arm spaced from the first arm. The magnetic field source may extend between the first and second arms of the magnetic yoke, and the magnetoelastic element may extend between respective first ends of the first and second arms of the magnetic yoke.

The magnetic yoke may include Silicon-Iron (Si—Fe), metglas, or other low loss soft ferromagnetic materials.

The at least one magnetoelastic element may include a first magnetoelastic element extending between the first ends of the first and second arms of the yoke, and a second magnetoelastic element extending between second ends of the first and second arms of the yoke opposite to the first ends.

Respective ends of the magnetoelastic element may be pinned to the first and second arms of the magnetic yoke.

The magnetic transmitter may include a suspension frame surrounding the magnetic yoke and a vibration isolation suspension coupling the magnetic yoke to the suspension frame.

A resonant frequency of the magnetoelastic element may be at least twice a resonant frequency of the vibration isolation suspension.

The magnetic field source may be a permanent magnet or an electromagnet.

The actuator may include at least one piezoelectric bending actuator or a voice coil actuator. The actuator may be configured to vibrate the magnetoelastic element at a resonance frequency of the magnetoelastic element.

The magnetic transmitter may include at least one concentrated mass coupled to the magnetoelastic element. The at least one concentrated mass is configured to tune a resonant frequency of the magnetoelastic element.

The magnetic field source may be a magnetic core, and the magnetoelastic element may include a series of magnetoelastic leaves arranged circumferentially around the magnetic core.

The magnetic transmitter may include a non-magnetic elastic member coupled to the magnetoelastic element. The non-magnetic elastic member is configured to induce stress in the magnetoelastic element.

The magnetic transmitter may include at least one preload actuator coupled to an end of the magnetoelastic element. The preload actuator is configured to apply compressive stress to the magnetoelastic element.

The magnetic transmitter may include a negative stiffness element in parallel with the magnetoelastic element and coupled to an intermediate portion of the magnetoelastic element. A negative stiffness of the negative stiffness element may be tunable.

The present disclosure is also directed to various methods of generating a low frequency electromagnetic signal from a vibrational magnetic transmitter. In one embodiment, the method includes inducing, from a magnetic field source, a magnetic flux in a magnetoelastic element proximate to the magnetic field source, and vibrating the magnetoelastic element. Vibrating the magnetoelastic element generates the low frequency electromagnetic signal due to magnetostriction.

Vibrating the magnetoelastic element may induce resonance in the magnetoelastic element.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

The features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

DETAILED DESCRIPTION

The present disclosure is directed to various embodiments of a vibrational magnetic transmitter. The vibrational magnetic transmitters of the present disclosure function as low frequency oscillating field sources based on magnetoelastic reluctance switching. The vibrational magnetic transmitters of the present disclosure utilize a magnetoelastic element that diverts magnetic flux into and out of a closed circuit path to control the far field magnetic field intensity. Additionally, the vibrational magnetic transmitters of the present disclosure utilize an actuator configured to vary the compressive load on the magnetoelastic element to provide frequency control. The vibrational magnetic transmitters of the present disclosure may be utilized in an antenna configuration in which the magnetic frequency or amplitude emitted by the magnetic transmitter is modulated to encode information (e.g., information which is received by a remote AC magnetic field sensor). The vibrational magnetic transmitter of the present disclosure may be utilized to communicate through solid or liquid barriers such as underground or underwater. For instance, the vibrational magnetic transmitters of the present disclosure may be utilized in the oil and gas industry to communicate with underground drilling equipment.

Figure 1:
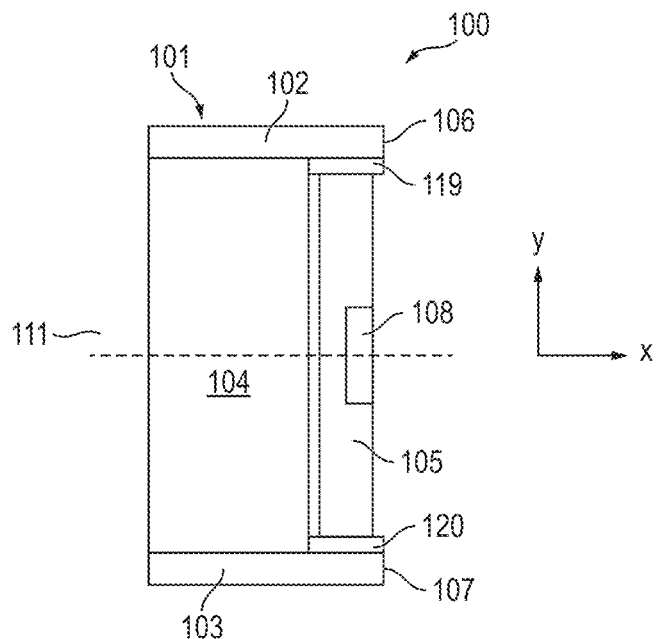
FIG. 1 is a cross-sectional view of a vibrational magnetic transmitter according to one embodiment of the present disclosure.

With reference now to FIG. 1, a vibrational magnetic transmitter 100 (e.g., an antenna) according to one embodiment of the present disclosure includes a magnetic yoke 101 having a first arm 102 and a second arm 103, a magnetic field source 104 extending between the first and second arms 102, 103 of the magnetic yoke 101, at least one magnetoelastic element 105 (e.g., a magnetoelastic switch) adjacent to the magnetic field source 104 and extending between first ends 106, 107 of the first and second arms, 102, 103, respectively, of the magnetic yoke 101, and an actuator 108 operably coupled to the magnetoelastic element 105. Additionally, in the illustrated embodiment, a total free space or a free space reluctance 111 is defined surrounding the vibrational magnetic transmitter 100. In one or more embodiments, the vibrational magnetic transmitter 100 may be provided without the yoke 101. In the illustrated embodiment, the magnetoelastic element 105 is oriented parallel or substantially parallel to the magnetic field source 104 (e.g., an axis of the magnetoelastic element 105 is parallel or substantially parallel to an axis of the magnetic field source 104).

In one or more embodiments, the actuator 108 may be integral with the magnetoelastic element 105. The magnetoelastic element 105 may be made out of any suitable magnetoelastic material, such as, for instance, FeGa, FeGaB, Terfenol-D, NiFe, FeCo, Ni, or an amorphous metal alloy ribbon, such as METGLAS Trademark. In one or more embodiments, the magnetoelastic element 105 may be combined with non-magnetic elastic materials to control the mode shape, frequency and deformation of the magnetoelastic element 105. The magnetic field source 104 may be a permanent magnet (e.g., a 100% permanent magnet), an electromagnet (e.g., a high magnetic saturation (Ms) electromagnetic material such as soft iron), or a combination of a permanent magnet and ferromagnetic material. In one or more embodiments in which the magnetic field source 104 includes a combination of a permanent magnet and ferromagnetic material, the ferromagnetic material is configured to convey the magnetic flux to the magnetoelastic member 105. In one or more embodiments, the magnetic field source 104 may be a neodymium (NdFeB) magnet. Although in the illustrated embodiment the magnetic field source 104 has a single magnetization direction, in one or more embodiments, the magnetic field source 104 may have any other suitable magnetic configuration, such as a clad magnetic construction. The optional magnetic yoke 101 is configured to conduct magnetic flux generated by the magnetic field source 104 to the one or more magnetoelastic elements 105. In one or more embodiments, the optional magnetic yoke 101 may be formed of a high permeability, low loss material, such as, for instance, Silicon-Iron (Si—Fe), laminated iron, or FeCo.

Figure 4:
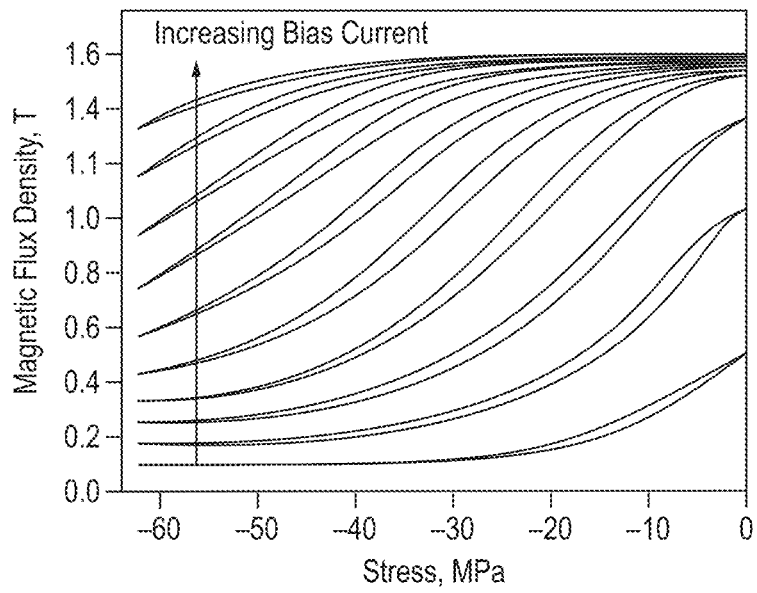
FIG. 4 is a graph depicting the change in magnetic induction in a magnetoelastic material as a function of compressive stress applied to the magnetoelastic material for different levels of constant applied magnetic fields.

With continued reference to the embodiment illustrated in FIG. 1, the actuator 108 is configured to vibrate or induce bending vibrations (e.g., harmonic vibrations) in the one or more magnetoelastic elements 105. In one or more embodiments, the actuator 108 may be configured to induce resonance in the one or more magnetoelastic elements 105. Vibration of the one or more magnetoelastic elements 105 by the actuator 108 creates a reluctance change due to magnetostriction. This change in reluctance changes the far field magnitude of the magnetic field generated by the transmitter 100. That is, the actuator 108 is configured to generate a stress-induced magnetization change in the one or more magnetoelastic elements 105, which is a consequence of the coupling of magnetic moment to applied lattice strain through magnetostriction. In one or more embodiments, the vibration of the one or more magnetoelastic elements 105 by the actuator 108 is configured to change a net magnetic dipole (e.g., the limit of a pair of poles as the dimensions of the source are reduced to zero while keeping the magnetic moment constant) of the vibrational magnetic transmitter 100. FIG. 4 depicts the variation in magnetic flux density (T) for a Galfenol (FeGa) magnetoelastic element 105 as a function of the stress applied to the magnetoelastic element 105. Each band in FIG. 4 depicts a different constant magnetic field applied to the magnetoelastic element 105, and an increasing bias current corresponds to an increasing applied magnetic field. For materials with a positive magnetostriction, an applied compressive stress along the direction of the applied magnetic field will effectively rotate the magnetization away from the applied field, resulting in a decrease in magnetization and magnetic flux density. Conversely, tension in a magnetoelastic material with a positive magnetostriction will increase the permeability and reduce the reluctance. As illustrated in FIG. 4, for each band corresponding to a constant applied magnetic field, the magnetic flux density decreases with increasing stress applied to the magnetoelastic element 105, and the magnetic flux density subsequently increases as the stress applied to the magnetoelastic element 105 is reduced back to zero. In this manner, a change in magnetic flux can be achieved by applying a stress to the one or more magnetoelastic elements 105 with the actuator 108.

Figure 2:
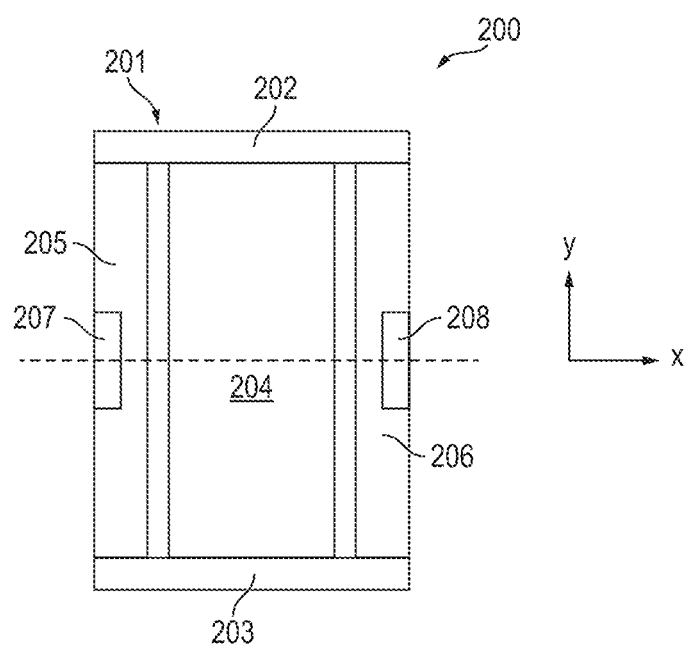
FIG. 2 is a cross-sectional view of a vibrational magnetic transmitter according to another embodiment of the present disclosure.

FIG. 2 depicts a vibrational magnetic transmitter 200 according to another embodiment of the present disclosure. In the illustrated embodiment, the vibrational magnetic transmitter 200 has a symmetrical configuration including an optional magnetic yoke 201 formed of a high permeability, low loss material such as Si—Fe including first and second arms 202, 203, a magnetic field source 204 (e.g., an electromagnet, a permanent magnet such as NdFeB, or a combination of a permanent magnet and ferromagnetic material) extending between the first and second arms 202, 203 of the magnetic yoke 201, a pair of magnetoelastic elements 205, 206 on opposite sides of the a magnetic field source 204 and extending between opposite ends of the arms 202, 203 of the magnetic yoke 201, and at least one actuator 207, 208 coupled to the magnetoelastic elements 205, 206, respectively. Additionally, in one or more embodiments, the vibrational magnetic transmitter 200 also includes one or more mechanisms for modulating the magnetic signal generated by the transmitter 200 to encode information, such as, for instance, pre-load actuators coupled to opposite ends of the magnetoelastic elements 205, 206 and configured to apply a compressive force to the magnetoelastic elements 205, 206, or at least one negative stiffness mechanism coupled to the magnetoelastic elements 205, 206, the significance of which is described below with reference to FIGS. 9A-9B.

Figure 3A:
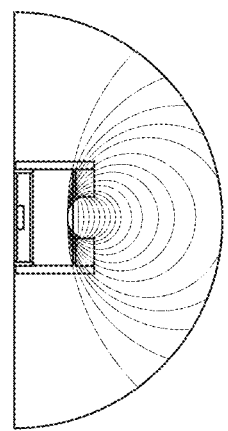
FIGS. 3A-3B depict propagation of a magnetic field emitted from an embodiment of the vibrational magnetic transmitter in a stressed state (e.g., an on state) and an unstressed state (e.g., an off state), respectively.
Figure 3B:
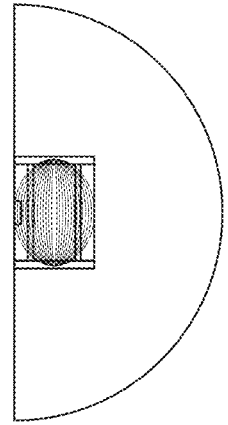

FIGS. 3A-3B depict the propagation of the magnetic field from the magnetic transmitter 100 when the one or more magnetoelastic elements 105 are in a stressed state or condition and when the one or more magnetoelastic elements 105 are in an unstressed or oppositely stressed state or condition, respectively. As illustrated in FIG. 3A, when the actuator 108 is actuated to vibrate (i.e., stress) the one or more magnetoelastic elements 105, the magnetic transmitter 100 will begin to produce an oscillating magnetic field synchronized to the mechanical vibrations from the magnetic transmitter 100. As illustrated in FIG. 3B, when the actuator 108 is not being actuated to induce vibrations (i.e., stress) in the one or more magnetoelastic elements 105, the magnetic transmitter 100 is in an 'off' state and no alternating magnetic field propagates from the magnetic transmitter 100.

Figure 5:
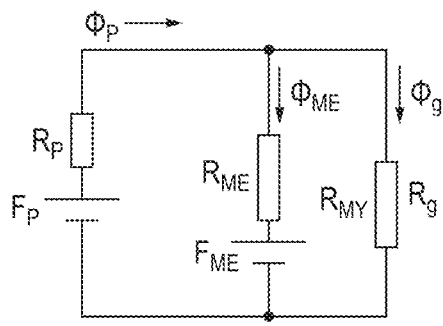
FIG. 5 is a magnetic circuit diagram for a vibrational magnetic transmitter according to one embodiment of the present disclosure.

FIG. 5 depicts a magnetic flux circuit for the embodiment of the transmitter 100 illustrated in FIG. 1. In FIG. 5, the magnetic field source 104 (e.g., the permanent magnet) is represented with a magnetic force potential $F_P$ and a reluctance $R_P$ for the magnetic field source 104. Additionally, in FIG. 5, the magnetoelastic element 105 is represented by a reluctance $R_{ME}$ and a magnetic force potentiation $F_{ME}$. The magnetic yoke 101 is omitted in FIG. 5 due to the very low reluctance magnetic yoke 101. The reluctance due to the free air space 111 is represented by the reluctance $R_g$ and represents all flux leakage paths to free space combined into a single term.

The physics of the transmitter are demonstrated by the magnetic flux circuit depicted in FIG. 5. The magnetic field source 104 (e.g., the permanent magnet or the electromagnet) applies a large magnetic field bias to the system, while the magnetoelastic element 105 functions as a type of variable permanent magnet that provides a variable amount of magneto-mechanical force and reluctance that alters the magnetic flux path in the circuit. If the magnetic flux is routed between a low reluctance return path and a high reluctance air gap, the magnitude of magnetic flux coupled to the air space surrounding the transmitter 100 will be modulated in proportion to the change in magnetoelastic properties.

The flux in the magnetoelastic material of the magnetoelastic element 105 can be assessed or approximated by the linear magnetoelastic constitutive relations as follows:

$$B_{ME} = \mu_{ME} H_{ME0} + d_{ME} T_{ME}$$

Where $\mu_{ME}$ is the permeability of the magnetoelastic element 105, $H_{ME}$ the applied magnetic field, $d_{ME}$ is the magnetoelastic coupling coefficient, and $T_{ME}$ is the stress applied to the magnetoelastic element 105 by the actuator 108. This equation illustrates the direct coupling between the magnetic flux and the applied stress to the magnetoelastic element 105.

Following the magnetic circuit analysis and neglecting higher order terms, the change in flux into the air gap 111 is assessed or approximated by:

$$\Delta \phi_g = C \frac{d_{ME}}{L_{ME}} \int_{V_m} T_{ME} dv$$

Where C is a constant that specifies the permeance (i.e., 1/Reluctance) fraction of the air gap 111 ($C = P_g/(P_{PM} + P_{ME})$), and $V_m$ is the total volume of magnetic material. According to this equation, the gap flux is proportional to the magnetoelastic coupling coefficient and the average volumetric stress in the magnetoelastic element 105. If the stress is a harmonic function, the flux through the gap 111 and thus the far field magnetic radiation, will exhibit the same fundamental harmonic properties.

Figure 6:
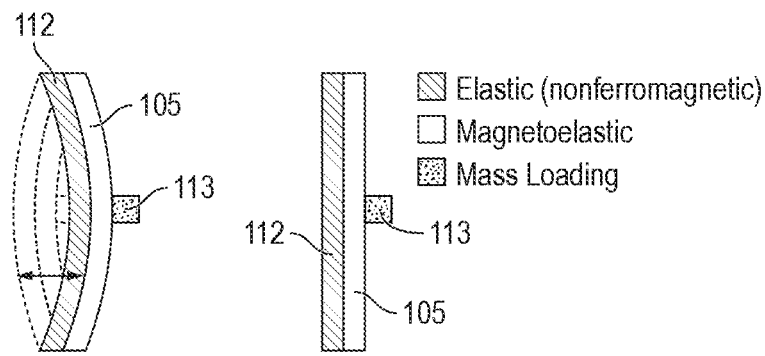
FIG. 6 depicts a cross-sectional view of a magnetoelastic component according to one embodiment of the present disclosure.

With reference now to FIG. 6, the transmitter 100 according to one embodiment includes a non-magnetic elastic member 112 coupled (e.g., bonded) to each of the one or more magnetoelastic elements 105 (e.g., the transmitter 100 includes a composite construction including one or more magnetoelastic elements 105 coupled to one or more corresponding non-magnetic elastic members 112). When operating in a bending vibration mode, the elastic member 112 is configured to ensure that the magnetoelastic element 105 experiences the more uniform stress of the same orientation (e.g., tension or compression) when operated in a bending mode. Since tension and compression have opposite effects on the permeability of the magnetoelastic element 105, utilizing the elastic member 112 to bias the stress locates the neutral axis of the beam outside the magnetoelastic member 105 so that the stress is oriented uniformly, which improves the performance of the magnetoelastic element 105 in terms of total change in reluctance compared to a transmitter provided without the elastic member 112. In one or more embodiments, the magnetic flux ratio between the stressed and unstressed states, which is maximized to increase performance, can be increased from a maximum of approximately (or about) 2 in an embodiment in which the transmitter 100 does not include the non-magnetic elastic members 112 (e.g., a monolithic construction) to approximately (or about) 10 or more in an embodiment of the transmitter 100 including one or more non-magnetic elastic members 112 coupled to each of the one or more magnetoelastic elements 105 (e.g., a composite construction).

Additionally, as illustrated in the embodiment of FIG. 6, one or more concentrated masses 113 may be attached to various locations of the one or more magnetoelastic elements 105 to alter and tune the resonant frequency and increase the quality factor of the one or more magnetoelastic elements 105 as well as shape the stress state in the magnetoelastic element 105 to increase the total reluctance change.

Figure 7A:
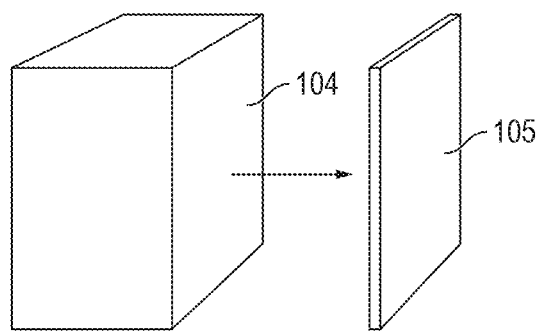
FIGS. 7A-7B depict a configuration including a single magnetoelastic panel component engaging one side of a magnetic element and a barrel-type configuration including a series of magnetoelastic components circumferentially surrounding a central magnetic core, respectively, according to embodiments of the present disclosure.
Figure 7B:
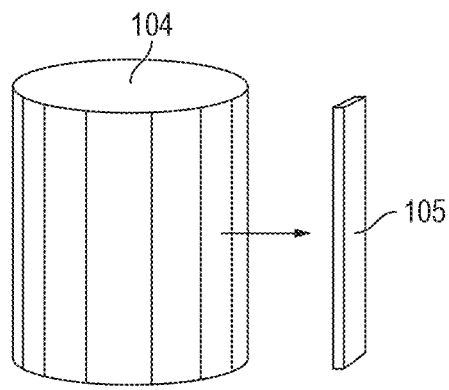

FIGS. 7A-7B depict configurations of the one or more magnetoelastic elements 105 and the magnetic field source 104 (e.g., the permanent magnet) according to various embodiments of the present disclosure. In each of these embodiments, the magnetoelastic element 105 is operated in a bending mode vibration. In the embodiment illustrated in FIG. 7A, the transmitter 100 includes a single magnetoelastic panel or plate 105 positioned along one side of the magnetic field source 104. In one or more embodiments, the transmitter 100 may include a series of magnetoelastic plates 105 positioned at two or more sides of the magnetic field source 104. In the embodiment illustrated in FIG. 7B, the transmitter 100 includes a series of high aspect ratio magnetoelastic elements 105 (e.g., magnetoelastic leaves) circumferentially surrounding a central magnetic core 104. In one or more embodiments, the high aspect ratio magnetoelastic elements 105 may be arranged in circular symmetry around the central magnetic core 104. The high aspect ratio magnetoelastic elements 105 are configured to vibrate in unison or substantially in unison (i.e., synchronously or substantially synchronously). In one or more embodiments, the high aspect ratio magnetoelastic elements 105 circumferentially arranged around the central magnetic core 104 may be coupled together (e.g., mechanically joined together) in the lateral dimension to facilitate dynamic synchronization of the high aspect ratio magnetoelastic elements 105.

Figure 8A:
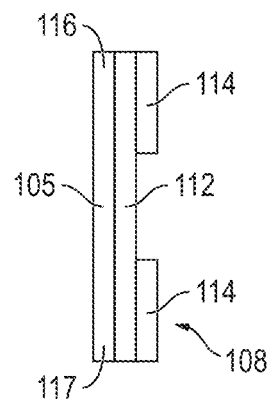
FIGS. 8A-8B depict a series of piezoelectric bending actuators and a voice coil actuator, respectively, for inducing vibration of a magnetoelastic component according to embodiments of the present disclosure.
Figure 8B:
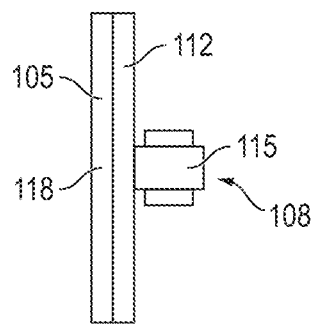

As illustrated in FIGS. 8A-8B, the actuator 108 may include one or more piezoelectric bending actuators 114 or a voice coil 115 configured to induce vibrations in the one or more magnetoelastic elements 105. The one or more actuators may be positioned at any suitable locations or locations along the one or more magnetoelastic elements 105. In one or more embodiments, the one or more actuators may be positioned at the most efficient location or locations along the magnetoelastic element 105, such as the location of maximum strain. For instance, in an embodiment in which the ends of the one or more magnetoelastic elements 105 are fixed (e.g., pinned or clamped) to the magnetic yoke 101, the actuator 108 may include a first pair of piezoelectric bending actuators 114 located on opposite sides of a first end 116 of the magnetoelastic element 105 and, optionally, a second pair of piezoelectric bending actuators 114 located on opposite sides of a second end 117 of the magnetoelastic element 105 opposite the first end 116. In one or more embodiments in which the ends 116, 117 of the one or more magnetoelastic elements 105 are free to rotate with respect to the magnetic yoke 101, the actuator 108 may include a pair of piezoelectric bending actuators located on opposite sides of an intermediate portion (e.g., a center portion) of the magnetoelastic element 105 between the first and second ends 116, 117. The piezoelectric bending actuators 114 are configured to mechanically strain in response to an applied electric field due to the reverse piezoelectric effect.

In the embodiment illustrated in FIG. 8B, the actuator 108 is a voice coil actuator 115 operably coupled to an intermediate portion 118 (e.g., the center portion) of the magnetoelastic element 105 between the first and second ends 116, 117. In one or more embodiments, the voice coil actuator 115 is configured to apply an oscillating force to the magnetoelastic element 105.

In one or more embodiments, to provide high amplitude stress and maximize the change in reluctance, the actuator 108 is configured to operate or actuate the one or more magnetoelastic elements 105 in a state of vibration resonance around a flexural natural mode. The natural mode may be selected to create the desired stress profile in the magnetoelastic element 105. In one embodiment in which the single magnetoelastic plate 105 has a thickness of approximately (or about) 2 mm, a length of approximately (or about) 15 cm, and a width of approximately (or about) 5 cm, is formed of FeGa magnetoelastic material, and is bonded to a matched elastic modulus fiberglass member 112, and is operated in a pinned-pinned boundary condition, as shown for example in FIG. 6, the magnetoelastic element 105 exhibits a resonant frequency of approximately (or about) 1 kHz. In one or more embodiments, the transmitter 100 may also include one or more mechanisms for tuning a frequency of the one or more magnetoelastic elements 105.

In one or more embodiments, the vibrational magnetic transmitter 100 also includes one or more mechanisms for modulating the magnetic signal generated by the transmitter 100 to encode information. In one or more embodiments, the signal modulation may be achieved by direct modulation of the one or more magnetoelastic elements 105 (e.g., changing the excitation frequency at which the actuator 108 induces vibration in the one or more magnetoelastic elements 105). In one or more embodiments in which the one or more magnetoelastic elements 105 have a relatively low quality factor (Q factor), direct modulation of the one or more magnetoelastic elements 105 by changing the excitation frequency of the actuator 108 has a relatively low energy cost and the generation of the fundamental, natural frequency of the one or more magnetoelastic elements 105 has a relatively high power cost. In one or more embodiments in which the one or more magnetoelastic elements 105 have a relatively high Q factor, generation of the fundamental, natural frequency of the one or more magnetoelastic elements 105 has a relatively low power cost, but direct modulation of the one or more magnetoelastic elements 105 by changing the excitation frequency of the actuator 108 has a relatively high energy cost.

Accordingly, in one or more embodiments in which the one or more magnetoelastic elements 105 has a relatively high Q factor, the vibrational magnetic transmitter 100 includes one or more mechanisms for indirectly tuning the one or more magnetoelastic elements 105 to modulate the magnetic signal generated by the transmitter 100 and thereby encode information in the signal. In one or more embodiments, the mechanism for indirectly tuning the one or more magnetoelastic elements 105 may include one or more preload actuators for compressing the one or more magnetoelastic elements and/or coupling a negative stiffness mechanism to the one or more magnetoelastic elements 105.

Figure 9A:
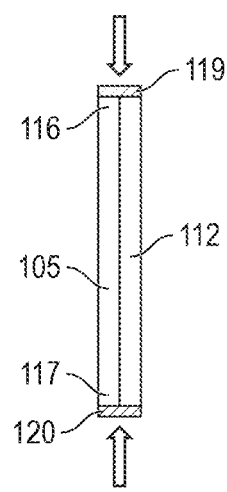
FIG. 9A depicts preload actuators for applying compressive stress to a magnetoelastic component to frequency tune the magnetoelastic component according to one embodiment of the present disclosure.
Figure 9B:
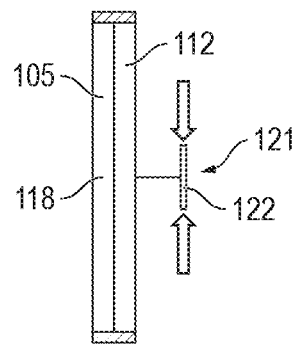
FIG. 9B depicts a negative stiffness coupled to a magnetoelastic component for frequency tuning of the magnetoelastic component according to one embodiment of the present disclosure.

FIGS. 9A and 9B depict two different embodiments for indirectly tuning the one or more magnetoelastic elements 105. In the embodiment illustrated in FIG. 9A, the transmitter 100 includes a pair of preload actuators 119, 120 coupled to the opposite ends 116, 117, respectively, of the magnetoelastic element 105 and the non-magnetic elastic member 112 that have fixed (e.g., clamped or pinned) boundary conditions. The preload actuators 119, 120 are configured to apply a compressive force to the magnetoelastic element 105 and the non-magnetic elastic member 112. The compressive force reduces the natural frequency of the magnetoelastic element 105 and the non-magnetic elastic member 112 as the compressive force approaches the Euler buckling force. In one or more embodiments, the transmitter 100 may be provided without the one or more non-magnetic elastic members 112 and the preload actuators 119, 120 may be configured to apply a compressive force only to the one or more magnetoelastic elements 105.

In the embodiment illustrated in FIG. 9B, the transmitter includes a negative stiffness mechanism 121 coupled to the one or more magnetoelastic elements 105. In the illustrated embodiment, the negative stiffness mechanism 121 is mechanically in parallel with the intermediate portion 118 (e.g., the center) of the one or more magnetoelastic elements 105. Negative stiffness mechanisms are mechanisms where the reaction force of the mechanism to an applied displacement of the mechanism is in the same direction as the displacement, rather than opposing the displacement. The negative stiffness mechanism 121 may be any suitable type or kind of negative stiffness mechanism, such as, for instance, a roller-cam mechanism, a snap-through mechanism, a buckled beam, and/or a beam compressed at the ends of the beam. In the embodiment illustrated in FIG. 9B, a negative stiffness beam 122 having a compressive force applied to the ends of the negative stiffness beam 122 is coupled to the one or more magnetoelastic elements 105. Varying the compressive force applied to the negative stiffness beam 122 changes the response of the one or more magnetoelastic elements 105 and thereby modulates the magnetic signal generated by the transmitter 100. For instance, increasing the compressive force applied to the negative stiffness beam 122 increases the negative stiffness force transmitted to the one or more magnetoelastic elements 105, which softens the elastic stiffness and reduces the natural frequency of the one or more magnetoelastic elements 105. In one or more embodiments, a compression load from approximately (or about) 5% to approximately (or about) 10% of the critical load may be applied to the one or more magnetoelastic elements 105 to achieve useful tuning of the one or more magnetoelastic elements 105.

Figure 10:
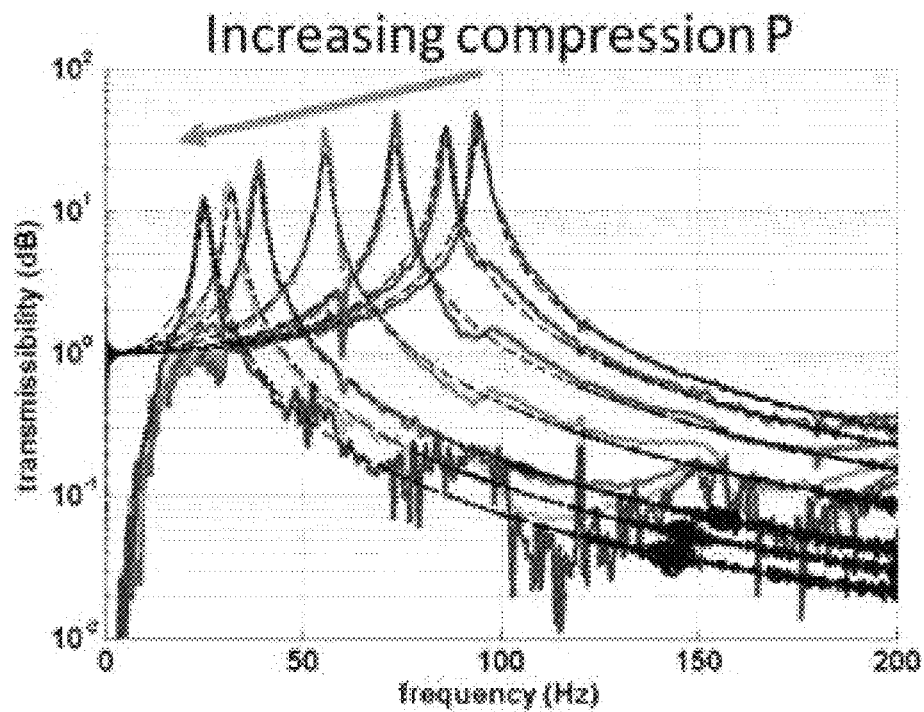
FIG. 10 is a graph depicting transmissibility as a function of frequency for negative stiffness beams having different applied compressive loads.

In one or more embodiments, indirectly tuning the one or more magnetoelastic elements 105 to modulate the magnetic signal generated by the transmitter 100 (e.g., by compressing end of the one or more magnetoelastic elements 105 with the preload actuators 119, 120 as illustrated in FIG. 9A or coupling a negative stiffness mechanism 121 to the one or more magnetoelastic elements 105 as illustrated in FIG. 9B) is more efficient than directly tuning the one or more magnetoelastic elements 105 because it indirectly changes the stiffness of the oscillator rather adds energy at a different frequency. For instance, in one or more embodiments, indirectly tuning the one or more magnetoelastic elements 105 may be from approximately (or about) 10 times to approximately (or about) 100 times more energy efficient than directly tuning the one or more magnetoelastic elements 105. FIG. 10 depicts the transmissibility in decibels (dB) as a function of frequency (Hz) for negative stiffness members 121 having different compressive loads applied to the negative stiffness beam 122. As illustrated in FIG. 10, as the compressive load on the negative stiffness beam 122 is increased, the natural frequency of the negative stiffness beam 122 (i.e., the frequency corresponding to the peak in the graph) is reduced due to softening of the response.

Figure 11:
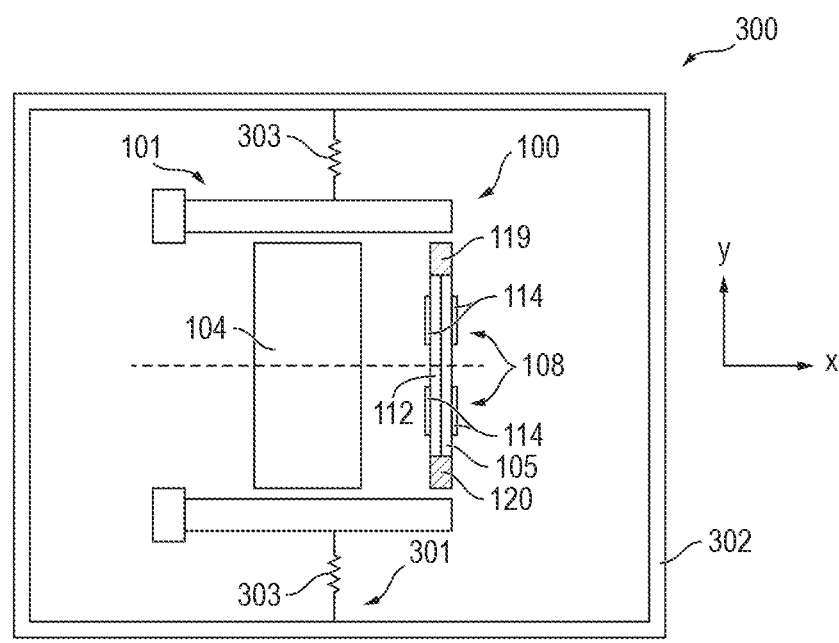
FIG. 11 depicts a vibrational magnetic transmitter including a vibration isolation system according to one embodiment of the present disclosure.

With reference now to FIG. 11, a transmitter system 300 according to one or more embodiments of the present disclosure includes magnetic transmitter 100 and a vibration isolation system 301 configured to reduce energy losses to the surrounding environment and/or surrounding components as well as reduce acoustic transmission from the magnetic transmitter 100. In the embodiment illustrated in FIG. 11, the vibration isolation system 301 includes a suspension frame 302 surrounding the magnetic transmitter 100 (e.g., the magnetic yoke 101, the magnetic field source 104, magnetoelastic element 105, and the actuator 108). In the illustrated embodiment, the magnetoelastic element 105 extends between respective first ends of first and second arms of the magnetic yoke 101, and an air gap is defined between respective second ends of the first and second arms of the yoke 101 opposite to the first ends. The air gap defines a high reluctance path. In the illustrated embodiment, the vibration isolation system 300 also includes a suspension 303 coupling the suspension frame 302 to the magnetic yoke 101 of the magnetic transmitter 100. The suspension 303 may be any suitable type or kind of isolation mechanism, such as, for instance, a spring-type system, a damper-type system, elastomer mounts, and/or combinations thereof. In one or more embodiments, the resonant frequency of the suspension 303 may be at least approximately (or about) 2 times lower (e.g., at least approximately (or about) 3 times lower) in frequency than the operational frequency of the magnetic transmitter 100. In one or more embodiments, the resonant frequency of the suspension 303 may be closer to the operational frequency of the magnetic transmitter 100 to provide lower damping, or may be further away from the operational frequency of the magnetic transmitter 100 to provide greater damping as desired. In one or more embodiments, the suspension 303 may be variable or adjustable according to acceleration and shock loads.

Additionally, in one or more embodiments, the transmitter system 300 may include a cover housing the vibration isolation system 301 and the magnetic transmitter 100. The cover is configured to protect the transmitter system 300 against damage. In one or more embodiments, the cover may be sufficiently stiff or rigid and air contained inside an interior cavity of the cover in which the vibration isolation system 301 and the magnetic transmitter 100 are housed may be evacuated to reduce acoustic transmission from the system 300 to the environment surrounding the system 300. In one or more embodiments, an interior of the cover may be lined with an acoustic absorber, such as a foam or fiber insulation, that is configured to limit the acoustic transmission from the system 300.

While certain embodiments of the present invention have been illustrated and described, it is understood by those of ordinary skill in the art that certain modifications and changes can be made to the described embodiments without departing from the spirit and scope of the present invention as defined by the following claims, and equivalents thereof. Although relative terms such as "outer," "inner," "upper," "lower," and similar terms have been used herein to describe a spatial relationship of one element to another, it is understood that these terms are intended to encompass different orientations of the various elements and components of the invention in addition to the orientation depicted in the figures. Additionally, as used herein, the term "substantially," "about," and similar terms are used as terms of approximation and not as terms of degree, and are intended to account for the inherent deviations in measured or calculated values that would be recognized by those of ordinary skill in the art. Moreover, the tasks described above may be performed in the order described or in any other suitable sequence. Additionally, the methods described above are not limited to the tasks described. Instead, for each embodiment, one or more of the tasks described above may be absent and/or additional tasks may be performed. Furthermore, as used herein, when a component is referred to as being "on" another component, it can be directly on the other component or components may also be present therebetween. Moreover, when a component is component is referred to as being "coupled" to another component, it can be directly attached to the other component or intervening components may be present therebetween.

What is claimed is:

1. A magnetic transmitter, comprising:
   at least one magnetoelastic element;
   a magnetic field source configured to induce a magnetic flux in the at least one magnetoelastic element, a lengthwise direction of the at least one magnetoelastic element being oriented parallel to a magnetic axis of the magnetic field source; and
   an actuator device on the at least one magnetoelastic element, the actuator device configured to bend the at least one magnetoelastic element in a direction perpendicular to the magnetic axis of the magnetic field source to induce harmonic vibration in the at least one magnetoelastic element, the harmonic vibration of the at least one magnetoelastic element being configured to change a net magnetic dipole of the magnetic transmitter due to magnetostriction.

2. The magnetic transmitter of claim 1, wherein the actuator device comprises a voice coil actuator.

3. A method of generating a low frequency electromagnetic signal from the magnetic transmitter of claim 1, the method comprising:
   inducing, from the magnetic field source, the magnetic flux in the magnetoelastic element proximate to the magnetic field source; and
   vibrating, with the actuator device, the magnetoelastic element, the vibrating the magnetoelastic element generating the low frequency electromagnetic signal due to magnetostriction.

4. The method of claim 3, wherein the vibrating the magnetoelastic element induces resonance in the magnetoelastic element.

5. A magnetic transmitter, comprising:
   at least one magnetoelastic element;
   a magnetic field source configured to induce a magnetic flux in the at least one magnetoelastic element, the at least one magnetoelastic element being oriented parallel to a magnetic axis of the magnetic field source; and
   an actuator operably coupled to the at least one magnetoelastic element, the actuator configured to induce harmonic vibration in the at least one magnetoelastic element, the harmonic vibration of the at least one magnetoelastic element being configured to change a net magnetic dipole of the magnetic transmitter due to magnetostriction,
   wherein the actuator comprises at least one piezoelectric bending actuator.

6. The magnetic transmitter of claim 5, further comprising a magnetic yoke comprising a first arm and a second arm spaced from the first arm,
   wherein the magnetic field source extends between the first and second arms of the magnetic yoke, and
   wherein the at least one magnetoelastic element extends between respective first ends of the first and second arms of the magnetic yoke.

7. The magnetic transmitter of claim 6, wherein the magnetic yoke comprises Si—Fe.

8. The magnetic transmitter of claim 6, wherein the at least one magnetoelastic element comprises:
   a first magnetoelastic element extending between the first ends of the first and second arms of the magnetic yoke; and
   a second magnetoelastic element extending between second ends of the first and second arms of the magnetic yoke opposite to the first ends.

9. The magnetic transmitter of claim 6, wherein respective ends of the at least one magnetoelastic element are pinned to the first and second arms of the magnetic yoke.

10. The magnetic transmitter of claim 6, further comprising:
    a suspension frame surrounding the magnetic yoke; and
    a vibration isolation suspension coupling the magnetic yoke to the suspension frame.

11. The magnetic transmitter of claim 10, wherein a resonant frequency of the at least one magnetoelastic element is at least twice a resonant frequency of the vibration isolation suspension.

12. The magnetic transmitter of claim 5, wherein the magnetic field source is a permanent magnet.

13. The magnetic transmitter of claim 5, wherein the magnetic field source is an electromagnet.

14. The magnetic transmitter of claim 5, wherein the actuator is configured to vibrate the at least one magnetoelastic element at a resonance frequency of the at least one magnetoelastic element.

15. The magnetic transmitter of claim 5, further comprising at least one concentrated mass coupled to the at least one magnetoelastic element, the at least one concentrated mass being configured to tune a resonant frequency of the at least one magnetoelastic element.

16. The magnetic transmitter of claim 5, wherein the magnetic field source is a magnetic core, and wherein the at least one magnetoelastic element comprises a plurality of magnetoelastic leaves arranged circumferentially around the magnetic core.

17. The magnetic transmitter of claim 5, further comprising a non-magnetic elastic member coupled to the at least one magnetoelastic element, the non-magnetic elastic member being configured to induce stress in the at least one magnetoelastic element.

18. The magnetic transmitter of claim 5, further comprising at least one preload actuator coupled to an end of the at least one magnetoelastic element, the at least one preload actuator configured to apply compressive stress to the at least one magnetoelastic element.

19. The magnetic transmitter of claim 5, further comprising a negative stiffness element in parallel with the at least one magnetoelastic element and coupled to an intermediate portion of the at least one magnetoelastic element, wherein a negative stiffness of the negative stiffness element is tunable.

20. A magnetic transmitter, comprising:
a magnetic yoke comprising a first arm and a second arm spaced from the first arm;
a magnetic field source extending between the first and second arms of the magnetic yoke;
a magnetoelastic element extending between respective first ends of the first and second arms of the magnetic yoke and being oriented parallel to a magnetic axis of the magnetic field source, the magnetic field source being configured to induce a magnetic flux in the magnetoelastic element;
an air gap defined between respective second ends of the first and second arms of the yoke opposite to the first ends, the air gap defining a high reluctance path; and
an actuator device on the magnetoelastic element, the actuator device configured to induce harmonic vibration in the magnetoelastic element, the harmonic vibration of the magnetoelastic element being configured to change a net magnetic dipole of the magnetic transmitter due to magnetostriction.

21. A magnetic transmitter, comprising:
a magnetic yoke comprising a first arm and a second arm spaced from the first arm;
a magnetic field source extending between the first and second arms of the magnetic yoke;
a first magnetoelastic element extending between respective first ends of the first and second arms of the magnetic yoke and being oriented parallel to a magnetic axis of the magnetic field source;
a second magnetoelastic element extending between respective second ends of the first and second arms of the magnetic yoke opposite the first ends and being oriented parallel to a magnetic axis of the magnetic field source, the magnetic field source being configured to induce a magnetic flux in the first and second magnetoelastic elements, and a lengthwise direction of each of the first and second magnetoelastic elements being oriented parallel to a magnetic axis of the magnetic field source;
an actuator device on each of the first and second magnetoelastic elements, the actuator device configured to bend a respective one of first and second magnetoelastic elements in a direction perpendicular to the magnetic axis of the magnetic field source to induce harmonic vibration in each of the first and second magnetoelastic elements, the harmonic vibration of each of the first and second magnetoelastic elements being configured to change a net magnetic dipole of the magnetic transmitter due to magnetostriction.

* * * * *